United States Patent
Chin

(10) Patent No.: US 7,165,443 B2
(45) Date of Patent: Jan. 23, 2007

(54) VACUUM LEAKAGE DETECTING DEVICE FOR USE IN SEMICONDUCTOR MANUFACTURING SYSTEM

(75) Inventor: Kyoung-Hwan Chin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 25 days.

(21) Appl. No.: 10/967,195

(22) Filed: Oct. 19, 2004

(65) Prior Publication Data

US 2005/0081605 A1    Apr. 21, 2005

(30) Foreign Application Priority Data

Oct. 20, 2003  (KR) ............. 10-2003-0072868

(51) Int. Cl.
*G01M 3/04* (2006.01)
(52) U.S. Cl. ............................................. 73/40.7
(58) Field of Classification Search .......... 73/40.7
See application file for complete search history.

(56) References Cited

U.S. PATENT DOCUMENTS

| | | | | |
|---|---|---|---|---|
| 3,416,359 A | * | 12/1968 | Durbin et al. ............ | 73/40.7 |
| 3,578,758 A | * | 5/1971 | Altshuler ................. | 73/40.7 |
| 3,824,839 A | * | 7/1974 | Briggs .................... | 73/40.7 |
| 3,939,695 A | * | 2/1976 | Booth ..................... | 73/40.7 |
| 4,785,666 A | * | 11/1988 | Bergquist ................ | 73/40.7 |
| 5,131,263 A | * | 7/1992 | Handke et al. .......... | 73/40.7 |
| 5,317,900 A | * | 6/1994 | Bergquist ................ | 73/40.7 |
| 5,703,281 A | * | 12/1997 | Myneni ................... | 73/40.7 |
| 6,286,362 B1 | * | 9/2001 | Coffman et al. ......... | 73/40.7 |
| 6,658,920 B2 | * | 12/2003 | Abbel ..................... | 73/40 |
| 6,914,927 B2 | * | 7/2005 | Watson et al. ........... | 372/58 |
| 6,964,187 B2 | * | 11/2005 | Pillion .................... | 73/1.07 |

* cited by examiner

*Primary Examiner*—Michael Cygan
(74) *Attorney, Agent, or Firm*—Volentine Francos & Whitt, PLLC

(57) ABSTRACT

A vacuum leakage detecting device includes a process chamber for performing processes, a fluid valve, and a dry pump. The device further includes a helium gas sensor to detect helium gas in order to check vacuum leaks in potential external leak points.

2 Claims, 2 Drawing Sheets

VACUUM LEAKAGE DETECTING DEVICE FOR USE IN SEMICONDUCTOR MANUFACTURING SYSTEM

BACKGROUND AND SUMMARY

1. Field of the Invention

The present invention relates to a semiconductor manufacturing system, and more particularly, to a vacuum leakage detecting device for detecting vacuum leaks in the manufacturing system.

A claim of priority is made under 35 U.S.C. §119 for Korean Patent Application 2003-72868, filed on Oct. 20, 2003, the contents of which are hereby incorporated in its entirety by reference.

2. Description of the Related Art

A semiconductor device is generally fabricated by selectively and repetitively performing photolithography, etching, diffusion, chemical vapor deposition, ion implantation, and metal deposition processes on a wafer. The manufacturing processes are performed by supplying process gases into the interior of a closed process chamber to react the gases with a wafer placed within the process chamber. This semiconductor fabrication process is usually conducted under a vacuum state, and where the vacuum state is accurately maintained in the process chamber, the fabrication process is more efficient.

Most semiconductor manufacturing systems are provided with a vacuum leakage sensing device to detect vacuum leakages. However, even if the vacuum sensing device detects a vacuum leakage, it is difficult to accurately determine the exact source of the vacuum leakage. In order to determine the specific source of the leakage, an operator must disassemble and check each individual component.

FIG. 1 illustrates a conventional semiconductor manufacturing system capable of detecting vacuum leakages.

The semiconductor manufacturing system has the following configuration. Process chamber 10 is provided that is capable of performing various manufacturing processes, such as deposition, plasma, diffusion, chemical vapor deposition processes, etc.

Gas supply line 24 is connected to an upper portion of process chamber 10. Air valve 26 is installed on gas supply line 24 to control the flow of gas to process chamber 10.

Mass flow controller (MFC) 28 is connected to gas supply line 24 to regulate the flow of gas through air valve 26 into process chamber 10.

Shower heads 14 are installed in process chamber 10 and connected to supply pipe 24, to evenly distribute gas within the interior of process chamber 10.

Heater 16 is installed in a lower portion of process chamber 10, to heat wafers (not shown).

Pump line 18 is connected to the lower portion of process chamber 10 at one end and connected to dry pump 22 at the other end. Pump line 18 is used to exhaust any residual gas from process chamber 10.

Fluid isolation valve 20 is installed on pump line 18 to isolate process chamber 10 and dry pump 22.

The conventional semiconductor manufacturing system supplies gas from gas supply line 24 and heat from heater 16. Also, a controller (not shown) operates dry pump 22 to remove unnecessary residual gas through pump line 18 from process chamber 10 to form a vacuum.

However, if a malfunction occurs in the conventional semiconductor manufacturing system while in operation or a predetermined number of uses have occurred, each one of the constituent parts must be disassembled from the process chamber 10 to be cleaned and then reassembled. After reassembling the constituent parts, an automatic leak detection program is run to check for proper sealage (i.e., lack of leakage). The automatic leak detection program closes fluid valve 20 and opens air valve 26, and then detects whether there is a gas leakage at one or more of several potential external leak points P1 through P9 within process chamber 10.

The conventional semiconductor manufacturing system can detect whether there is a gas leakage at one or more of the potential external leak points P1 through P9, but it may fail to detect a gas leak in the pump line 18 caused by the deterioration of an O-ring (not shown) in fluid valve 20.

Furthermore, when the externally exhausted gas is ventilated through pump line 18, a reaction between $SiH_4$ gas and air often will cause a powdery residue to form in the pump line 18. The resulting loss in vacuum pressure causes a process defect, such as voids in a metal layer being deposited on a substrate in the process chamber 10, to occur.

Accordingly, it is desirable to provide a vacuum leakage detecting device for use in a semiconductor manufacturing system, which is capable of detecting gas leakage at several external and internal leak points. It is further desirable to provide a vacuum leakage detecting device capable preventing the formation of metal voids.

SUMMARY OF INVENTION

According to one aspect of the present invention, a vacuum leakage detecting device adapted for use in a semiconductor manufacturing system includes a process chamber, a pump line connected to a lower portion of the process chamber, and a fluid isolation valve installed in the pump line to shut off the process chamber from the dry pump. The device also includes a helium gas sensor, which is installed on the pump line, which senses helium gas in order to check for vacuum leaks when an automatic leak detection program is run. In a related aspect, the vacuum leakage detecting device includes a controller for controlling the progression of the automatic leak detection program, and for outputting "helium gas detected information" when helium gas is detected through helium gas sensor.

BRIEF DESCRIPTION OF THE DRAWINGS

The present invention will become more fully understood from the detailed description given herein below and the accompanying drawings which are given by way of illustration.

DETAILED DESCRIPTION

Hereinafter, exemplary embodiments of the present invention will be described in detail with reference to FIG. 2. It will be understood by those skilled in the art that the present invention may be embodied in numerous different ways and is not limited to the following described embodiments. The following various embodiments are exemplary in nature. For purposes of clarity, a detailed description of known functions and components has been omitted.

Figure 1:
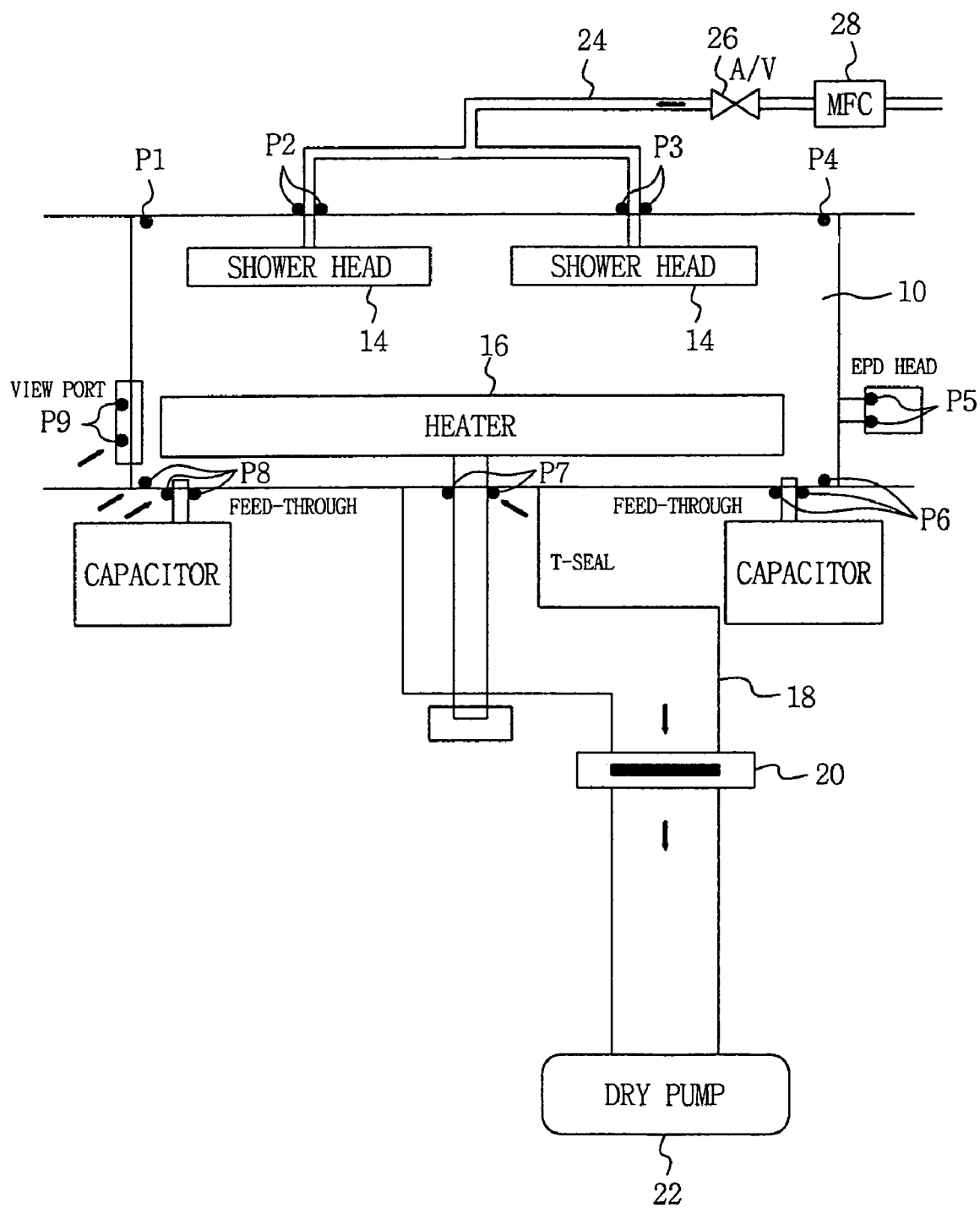
FIG. 1 is a diagram illustrating the structure of a conventional semiconductor manufacturing system having a vacuum leakage detecting device capable of detecting a vacuum leakage.
Figure 2:
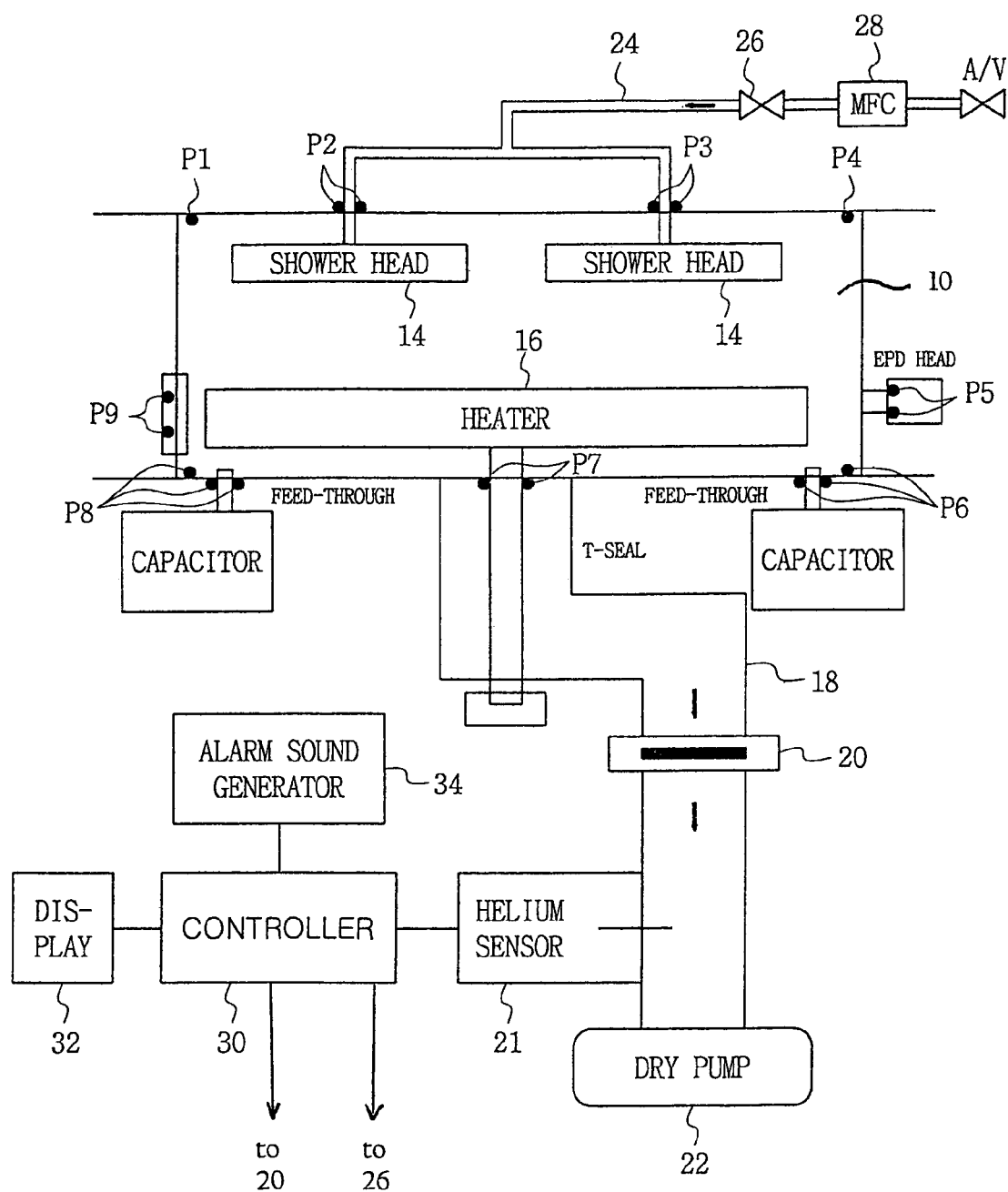
FIG. 2 is a diagram illustrating the structure of a semiconductor manufacturing system having a vacuum leakage detecting device capable of accurately detecting a vacuum leakage according to an exemplary embodiment of the present invention.

FIG. 2 illustrates the structure of a semiconductor manufacturing system having a vacuum leakage detecting device capable of accurately detecting vacuum leakages according to an exemplary embodiment of the present invention.

The semiconductor manufacturing system includes process chamber 10, gas supply line 24, gas supply valve 26, mass flow controller (MFC) 28, shower heads 14, heater 16, pump line 18, dry pump 22, fluid valve 20, helium gas sensor 21, controller 30, display 32, and alarm generator 34.

Process chamber 10 is capable of performing various manufacturing processes, such as deposition, plasma, diffusion, chemical vapor deposition processes, etc.

Gas supply line 24 is connected to an upper portion of process chamber 10. The gas supply valve 26 is installed on gas supply line 24 to supply gas to process chamber 10. The MFC 28 is connected to gas supply line 24 at one side of gas supply valve 26 to control the flow of gas into process chamber 10. Shower heads 14 are installed on process chamber 10 and connected to gas supply line 24 to evenly supply gas into the interior of process chamber 10.

Heater 16 is installed in the lower portion of process chamber 10, to heat wafers (not shown), pump line 18 is connected to the lower portion of process chamber 10 at one end and connected to a dry pump 22 at the other end. The pump line 18 is used to discharge any residual gas from the process chamber.

Fluid isolation valve 20 is installed on the pump line 18 to isolate the process chamber 10 and the dry pump 22 from one another.

Helium gas sensor 21 is installed on the pump line 18 at one end of fluid valve 20, to detect helium gas, thereby detecting leaks in fluid valve 20 when an automatic leak detection program is run.

Controller 30 controls the automatic leak detection program to check for vacuum leaks at numerous external leak points P1 through P9, and outputs helium gas detected information when helium gas is detected by helium gas sensor 21.

Display 32 displays the helium gas detected information outputted from controller 30.

Alarm generator 34 receives the helium gas sense information from controller 30 and then generates an alarm.

The operation of the semiconductor manufacturing system will be described in further detail with reference to FIG. 2.

Referring to FIG. 2, the semiconductor manufacturing system supplies gas from gas supply line 24 and heat from heater 16. Also, a controller 30 operates dry pump 22 to remove unnecessary residual gas from pump line 18 to form a vacuum in process chamber 10.

If the semiconductor manufacturing system malfunctions during the manufacturing operation or a predetermined number of uses have occurred, each one of the constituent parts must be disassembled from process chamber 10 to be checked or cleaned and then reassembled. At this time, an automatic leak detection program checks for proper sealage (i.e., lack of leakage) after the system has been reassembled.

The automatic leak detection program closes fluid valve 20 and opens gas supply valve 26 allowing helium gas into process chamber 10, and then determines whether process chamber 10 is completely sealed by detecting whether there is a leakage in any of the potential external leak points P1 through P9. In addition, helium gas sensor 21 installed on pump line 18 detects for the presence of helium gas. The controller 30 monitors the helium gas sensor 21 at this time. If helium gas is detected by helium gas sensor 21, a signal is applied to controller 30. When the helium gas detection signal is generated, controller 30 outputs helium gas detected information and displays the information on display 32, or generates an alarm by outputting a warning signal that drives alarm generator 34.

As described above, according to the exemplary embodiment of the present invention, in the vacuum leakage detecting device of the semiconductor manufacturing system, process defects void due to a gas leakage during the manufacturing process can be eliminated by installing a helium gas sensor on the portion of the pump line extending between the dry pump and the process chamber, and by sensing whether a fluid isolation valve installed in the pump line has a vacuum leak before the manufacturing process is initiated.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

What is claimed is:

1. A method of detecting vacuum leakage in equipment for processing a substrate, the method comprising:

closing an isolation valve disposed in a pump line that places a process chamber of the equipment in fluid communication with a dry pump of the equipment, whereby the dry pump is isolated from the process chamber;

subsequently supplying helium gas into the process chamber;

monitoring a portion of the pump line that extends between the isolation valve and the dry pump for the presence of helium gas therein while the isolation valve is closed; and issuing a warning signal representative of the penetration of helium gas into said portion of the pump line while the isolation valve is closed, thereby signaling the presence of a vacuum leak in the isolation valve.

2. The method of claim 1, wherein the supplying of helium gas comprises opening a gas valve disposed in a gas line connected to the process chamber, and the monitoring of the portion of the pump line that extends between the isolation valve and the dry pump for the presence of helium gas therein is carried out while the gas valve remains open.

* * * * *